(12) United States Patent
Robinson

(10) Patent No.: US 10,014,990 B2
(45) Date of Patent: Jul. 3, 2018

(54) TESTING APPARATUS FOR A HIGH SPEED CROSS OVER COMMUNICATIONS JACK AND METHODS OF OPERATING THE SAME

(71) Applicant: SENTINEL CONNECTOR SYSTEMS, INC., York, PA (US)

(72) Inventor: Brett D. Robinson, Chino, CA (US)

(73) Assignee: Sentinel Connector Systems, Inc., York, PA (US)

( * ) Notice: Subject to any disclaimer, the term of this patent is extended or adjusted under 35 U.S.C. 154(b) by 521 days.

(21) Appl. No.: 14/223,405

(22) Filed: Mar. 24, 2014

(65) Prior Publication Data
US 2014/0203820 A1 Jul. 24, 2014

Related U.S. Application Data

(63) Continuation-in-part of application No. 13/739,214, filed on Jan. 11, 2013, now Pat. No. 8,858,266.
(Continued)

(51) Int. Cl.
*H04L 1/24* (2006.01)
*H01R 13/6474* (2011.01)
(Continued)

(52) U.S. Cl.
CPC .......... *H04L 1/24* (2013.01); *H01R 13/6469* (2013.01); *H01R 13/6474* (2013.01);
(Continued)

(58) Field of Classification Search
None
See application file for complete search history.

(56) References Cited

U.S. PATENT DOCUMENTS 4,831,497 A * 5/1989 Webster ............... H05K 1/0228
174/32
4,875,862 A * 10/1989 Sakamoto ............. H05K 1/141
439/79
(Continued)

FOREIGN PATENT DOCUMENTS

JP 2003015902 A 1/2003

OTHER PUBLICATIONS

"XT/duroid™ 8100 High Frequency Materials Data Sheet", Rogers Corporation, Advanced Circuit Materials Division, Chandler AZ, Dec. 16, 2010.*
(Continued)

*Primary Examiner* — Jeffrey M Rutkowski
*Assistant Examiner* — Jonathan B Wood
(74) *Attorney, Agent, or Firm* — Vedder Price P.C.

(57) ABSTRACT

A testing unit including a substrate, a plurality of vias located in the substrate, a plurality of pin traces having a height and a width and each extending from a respective via towards an edge of the substrate and terminating at an end point, a plurality of termination points adjacent to the end points of the pin traces, a plurality of end traces having a height and a width with each end trace extending from an end point of a respective pin trace towards to a corresponding termination point near to the pin trace, a plurality of traces extending from the end of a respective end point or termination point to the edge of the substrate.

19 Claims, 5 Drawing Sheets

Related U.S. Application Data

(60) Provisional application No. 61/598,288, filed on Feb. 13, 2012.

(51) Int. Cl.
*H01R 13/6469* (2011.01)
*H05K 1/02* (2006.01)
*H01R 24/64* (2011.01)
*G01R 1/04* (2006.01)

(52) U.S. Cl.
CPC ........... *H05K 1/025* (2013.01); *G01R 1/0416* (2013.01); *H01R 24/64* (2013.01); *H05K 1/0228* (2013.01); *H05K 2201/09027* (2013.01); *H05K 2201/09236* (2013.01); *H05K 2201/10189* (2013.01)

(56) References Cited

U.S. PATENT DOCUMENTS

| | | | | |
|---|---|---|---|---|
| 5,271,043 A * | 12/1993 | Fouche | | H04B 7/005 375/367 |
| 5,373,187 A * | 12/1994 | Sugino | | H01L 23/49838 257/664 |
| 5,556,296 A * | 9/1996 | Dussausse | | H01R 4/2429 439/404 |
| 5,618,185 A * | 4/1997 | Aekins | | H01R 31/065 174/34 |
| 5,923,115 A * | 7/1999 | Mohr, III | | H01L 41/0475 310/334 |
| 6,168,474 B1 * | 1/2001 | German | | H05K 1/0228 439/620.01 |
| 6,231,397 B1 * | 5/2001 | de la Borbolla | | H01R 13/6477 439/676 |
| 6,509,807 B1 * | 1/2003 | Anthony | | H01L 23/50 257/E23.079 |
| 6,663,423 B2 | 12/2003 | Belopolsky et al. | | |
| 7,018,242 B2 | 3/2006 | Brown et al. | | |
| 7,402,085 B2 | 7/2008 | Hammond, Jr. et al. | | |
| 7,833,026 B1 * | 11/2010 | Morgan | | H01R 12/52 439/108 |
| 7,988,461 B1 * | 8/2011 | Morgan | | H01R 12/737 439/78 |
| 8,198,724 B1 * | 6/2012 | Wu | | H01L 23/49822 257/691 |
| 2002/0027488 A1 * | 3/2002 | Hayat-Dawoodi | | H01L 27/22 335/78 |
| 2002/0191140 A1 | 12/2002 | Eguchi et al. | | |
| 2004/0001028 A1 * | 1/2004 | Killen | | H01Q 1/38 343/795 |
| 2004/0014449 A1 * | 1/2004 | Adachi | | H04B 1/525 455/296 |
| 2004/0116081 A1 | 6/2004 | Crudele et al. | | |
| 2004/0147165 A1 * | 7/2004 | Celella | | H05K 1/0228 439/607.01 |
| 2006/0068582 A1 * | 3/2006 | Su | | H05K 1/0227 438/622 |
| 2006/0121792 A1 | 6/2006 | Hashim | | |
| 2007/0057359 A1 * | 3/2007 | Anthony | | H01R 13/719 257/691 |
| 2007/0222700 A1 * | 9/2007 | De Flaviis | | H01Q 1/2216 343/895 |
| 2008/0160837 A1 * | 7/2008 | Siemon | | H01R 13/6463 439/676 |
| 2009/0165294 A1 * | 7/2009 | Upadhyayula | | G06K 19/07732 29/825 |
| 2009/0186527 A1 * | 7/2009 | Hardell | | H01R 13/6471 439/633 |
| 2009/0303144 A1 * | 12/2009 | Hirano | | H01Q 1/243 343/750 |
| 2010/0134126 A1 * | 6/2010 | Hong | | G01R 3/00 324/754.03 |
| 2010/0267283 A1 * | 10/2010 | Pischl | | H01R 13/719 439/620.05 |
| 2011/0014818 A1 * | 1/2011 | Carter | | H01R 9/03 439/660 |
| 2011/0104933 A1 | 5/2011 | Straka et al. | | |
| 2012/0051735 A1 * | 3/2012 | Achkir | | H04L 43/50 398/16 |
| 2012/0100744 A1 | 4/2012 | Bolouri-Saransar | | H01R 13/6469 439/404 |
| 2012/0109568 A1 * | 5/2012 | M | | G06F 11/24 702/124 |
| 2012/0157011 A1 * | 6/2012 | Martineau | | H04B 1/48 455/78 |
| 2012/0182094 A1 * | 7/2012 | Kawamura | | H01Q 1/24 333/239 |
| 2013/0210277 A1 | 8/2013 | Robinson | | |
| 2014/0044157 A1 * | 2/2014 | Chang | | G11C 5/063 375/219 |
| 2014/0203417 A1 * | 7/2014 | Altunyurt | | H01L 23/64 257/664 |
| 2014/0323040 A1 * | 10/2014 | Rhein | | B60L 5/005 455/41.1 |

OTHER PUBLICATIONS

International Search Report and Written Opinion; filed in PCT/US2015/022032, dated Jul. 8, 2015; 9 pgs.
International Search Report and Written Opinion, filed in PCT/US2015/050599, dated Dec. 28, 2015. 13 pages.
Further Examination Report, dated Mar. 2, 2016, from New Zealand Intellectual Property Office.

* cited by examiner

TESTING APPARATUS FOR A HIGH SPEED CROSS OVER COMMUNICATIONS JACK AND METHODS OF OPERATING THE SAME

CROSS REFERENCE TO RELATED APPLICATIONS

This application is a continuation in part of U.S. patent application Ser. No. 13/739,214, filed Jan. 11, 2013, which is incorporated by reference herein in its entirety.

FIELD OF THE DISCLOSURE

The present disclosure relates to a testing framework of a network connection jack used to connect a network cable to a device.

BACKGROUND OF THE DISCLOSURE

As electrical communication devices and their associated applications become more sophisticated and powerful, their ability to gather and share information with other devices also becomes more important. The proliferation of these intelligent, inter networked devices has resulted in a need for increasing data throughput capacity on the networks to which they are connected to provide the improved data rates necessary to satisfy this demand. As a result, existing communication protocol standards are constantly improved or new ones created. Nearly all of these standards require or significantly benefit, directly or indirectly, from the communication of high-definition signals over wired networks. Transmission of these high definition signals, which may have more bandwidth and, commensurately, higher frequency requirements, need to be supported in a consistent fashion. However, even as more recent versions of various standards provide for theoretically higher data rates or speeds, they are still speed limited by the current designs of certain physical components. Unfortunately, the design of such physical components is plagued by a lack of understanding of what is necessary to achieve consistent signal quality at multi-gigahertz and higher frequencies.

For example, communication jacks are used in communication devices, and equipment for the connection or coupling of cables that are used to transmit and receive the electrical signals that represent the data being communicated. A registered jack (RJ) is a standardized physical interface for connecting telecommunications and data equipment. The RJ standardized physical interface includes both jack construction and wiring pattern. A commonly used RJ standardized physical interface for data equipment is the RJ45 physical network interface, also referred to as an RJ45 jack. The RJ45 jack is widely used for local area networks such as those implementing the Institute of Electrical and Electronic Engineers (IEEE) 802.3 Ethernet protocol. The RJ45 jack is described in various standards, including one that is promulgated by the American National Standards Institute (ANSI)/Telecommunications Industry Association (TIA) in ANSI/TIA-1096-A.

All electrical interface components, such as cables and jacks, including the RJ45 jack, not only resist the initial flow of electrical current, but also oppose any change to it. This property is referred to as reactance. Two relevant types of reactance are inductive reactance and capacitive reactance. Inductive reactance may be created, for example, based on a movement of current through a cable that resists, which causes a magnetic field that induces a voltage in the cable. Capacitive reactance, on the other hand, is created by an electrostatic charge that appears when electrons from two opposing surfaces are placed close together.

To reduce or avoid any degradation of transmitted signals, the various components of a communications circuit preferably have matching impedances. If not, a load with one impedance value will reflect or echo part of a signal being carried by a cable with a different impedance level, causing signal failures. For this reason, data communication equipment designer and manufacturers, such as cable vendors, design and test their cables to verify that impedance values, as well as resistance and capacitance levels, of the cables comply with certain performance parameters. The RJ45 jack is also a significant component in nearly every communications circuit, however, jack manufacturers have not provided the same level of attention to its performance. Thus, although problems related to existing RJ45 jacks are well documented in tests and their negative impact on high frequency signal lines is understood, the industry seems reluctant to address the issues for this important component of the physical layer. Consequently, there is a need for an improved high speed jack

BRIEF SUMMARY OF THE DISCLOSURE

One embodiment of the present invention discloses a testing unit including a substrate, a plurality of vias located in the substrate, a plurality of pin traces having a height and a width and each extending from a respective via towards an edge of the substrate and terminating at an end point, a plurality of termination points adjacent to the end points of the pin traces, a plurality of end traces having a height and a width with each end trace extending from an end point of a respective pin trace towards to a corresponding termination point near to the pin trace, a plurality of traces extending from the end of a respective end point or termination point to the edge of the substrate, where the end points of each pin trace are adjacent to each other and the termination points are adjacent to one another such that the pair of adjacent end traces and the pair of adjacent termination points are each adjacent to different traces.

In another embodiment, each pin trace is separated from each trace by a first distance.

In another embodiment, each end point is separated from each trace by a second distance.

In another embodiment, each termination point is connected to an end point of a pin trace that is not adjacent to the termination point by an end trace.

In another embodiment, adjacent pin traces are separated by a third distance.

In another embodiment, the testing unit includes a grounding plane in the substrate that is separated from each trace by a distance.

In another embodiment, the height and width of adjacent traces and a distance separating adjacent traces are adjusted such that the adjacent traces are magnetically coupled.

In another embodiment, the inductance and capacitance of each trace is adjusted by adjusting the first distance between the grounding plane and each trace.

In another embodiment, the height and width of adjacent end traces are adjusted such that the end traces are magnetically coupled.

In another embodiment, the substrate is RO XT8100, Rogers material.

In another embodiment, the capacitance of each trace is adjusted to between approximately 0.51 picofarads (pF) to approximately 2 pf.

In another embodiment, the inductance and capacitance of each trace is adjusted by adjusting a distance between the first ground plane and second ground plane and a distance between the first ground plane and each trace.

In another embodiment, a pin of an RJ 45 jack is connected to each via.

In another embodiment, an end of each trace is magnetically coupled to a connection unit.

In another embodiment, the connection unit is an RJ 59 connector.

In another embodiment, the height and width of adjacent pin traces and a distance separating adjacent pin traces are adjusted such that the adjacent pin traces are magnetically coupled.

In another embodiment, the height and width of adjacent end point and termination point and the distance separating adjacent end point and termination point are adjusted such that the adjacent end points and adjacent termination points are magnetically coupled.

In another embodiment, the inductance and capacitance of each end point and termination point are adjusted by adjusting the distance between the grounding plane and each end trace and each branch trace.

In another embodiment, the inductance and capacitance of each pin trace is adjusted along the length of the trace by adjusting the predetermined distance between the grounding plane and each end trace.

DETAILED DESCRIPTION OF THE DISCLOSURE

Figure 1:
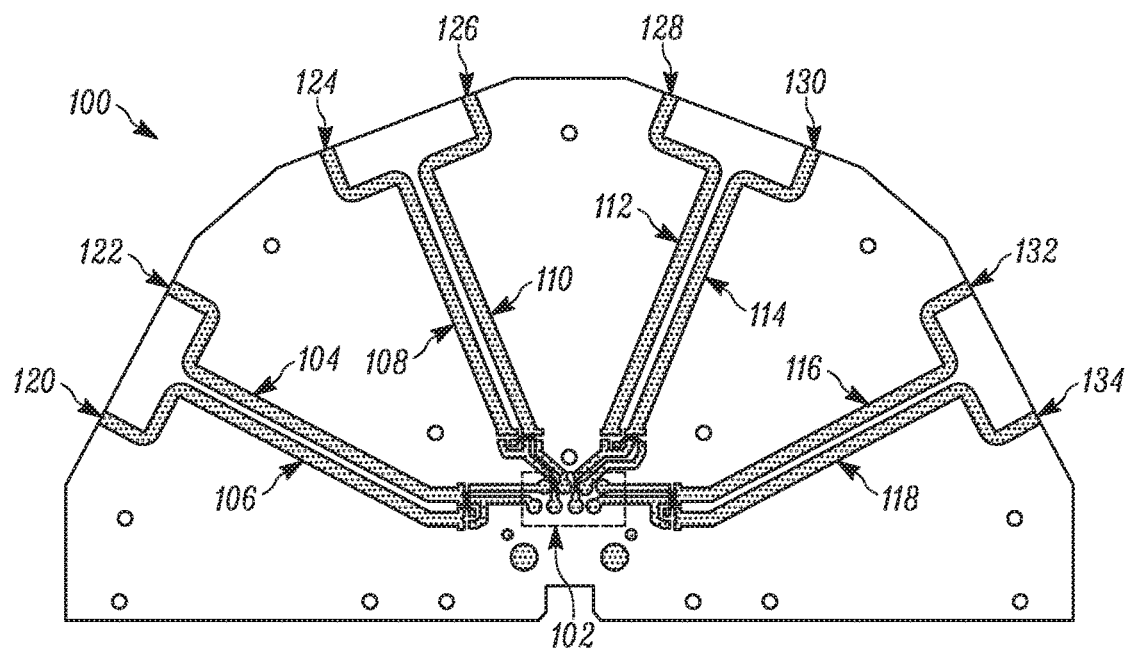
FIG. 1 illustrates a testing unit for a high speed communication jack.

FIG. 1 illustrates a testing unit 100 for a high speed communication jack. The testing unit 100, or testing framework, includes a pin connection portion 102 that is configured to affix to a high speed communication jack such as, but not limited to, a RJ 45 communication jack. Traces 104, 106, 108, 110, 112, 114, 116 and 118 extend radially from the pin connection portion 102 to the outer edge of the testing unit 100. The end of each trace 104, 106, 108, 110 112, 114, 116 and 118 terminates at the edge of the testing unit 100 to allow for the connection of a communication unit (not shown). The connection units 120, 122, 124, 126, 128, 130, 132 and 134 may be any type of connector including, but not limited to a RJ 45 connector.

Figure 2:
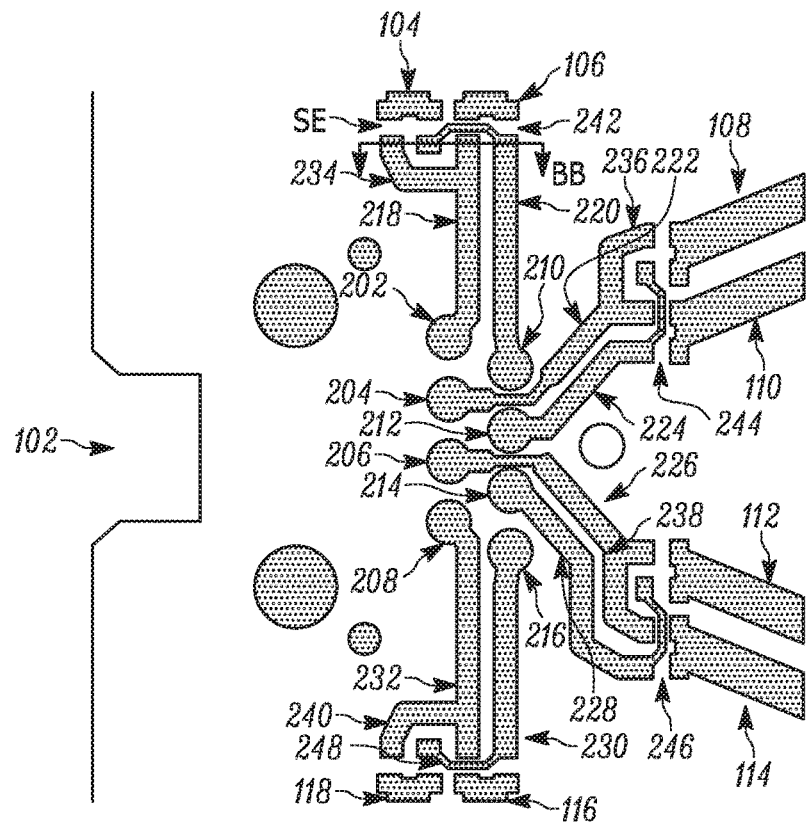
FIG. 2 illustrates a matching portion of the testing unit of FIG. 1.

FIG. 2 depicts a blown up view of another embodiment of the connection portion 102. The connection portion 102 includes vias 204, 206, 208, 210, 212, 214, 216, and 218 that are sized to engage the pins of a high speed communication jack. Pin traces 220, 222, 224, 226, 228 230 232 and 234 extend radially from the vias 204, 206, 208, 210, 212, 214, 216, and 218 towards the traces 104, 106, 108, 110, 112, 114, 116 and 118. Each pin trace 220, 222, 224, 226, 228, 230, 232 and 234 extends to an end point 236, 238, 240, 242, 244, 246, 248 and 250. Each pin trace 220, 222, 224, 226, 228, 230, 232 and 234 is also matched to an adjacent pin trace 220, 222, 224, 226, 228, 230, 232 and 234. As an illustrative example, pin trace 220 is matched to pin trace 222, pin trace 224 is match with pin trace 226, pin trace 228 is matched to pin trace 230 and pin trace 232 is matched to pin trace 234. Each pin trace 220, 222, 224, 226, 228, 230, 232 and 234 has a length (L), a height (H) and a width (W), and is separated from an adjacent pin trace by a distance (S). The width of each pin trace 220, 222, 224, 226, 228 230, 232 and 234 is approximately 35 mils. By adjusting the length, height and width of adjacent pin traces, the inductance of adjacent pin traces can be matched to each other. The end point 236, 238, 240, 242, 244, 246, 248 or 250 of each pin trace is separated from a respective trace 104, 106, 108, 110, 112 or 114 by a predetermined distance (Se).

End traces 252, 254, 256, 258, 260, 262, 264 and 266 extend from a respective end point 236, 238, 240, 242, 244, 246, 248 or 250 of a pin trace 220, 222, 224, 226, 228 230, 232 and 234 to a termination point 268, 270, 272, 274, 276, 278, 280 or 282. The end traces 252, 254, 256, 258, 260, 262, 264 and 266 may also extend from the side of the pin trace 220, 222, 224, 226, 228 230, 232 and 234 to the termination point 268, 270, 272, 274, 276, 278, 280 or 282. The termination points 268, 270, 272, 274, 276, 278, 280 or 282 are separated from the ends of each respective trace 104, 106, 108, 110, 112 or 114 by the predetermined distance Se. In one embodiment, the distance Se, is constant along the length of the end trace 252, 254, 256, 258, 260, 262, 264 and 266. In another embodiment, the distance Se, varies along the length of the end trace 252, 254, 256, 258, 260, 262, 264 and 266. Each end trace 252, 254, 256, 258, 260, 262, 264 and 266 has a length (L), width (W) and height (H). By adjusting the length, height and width of each end trace 252, 254, 256, 258, 260, 262, 264 and 266 in conjunction with the separation distance Se, different inductive and conductive configurations can be achieved. The width of each branch trace 234, 236, 238 and 240 may be approximately 35 mils. The width of each end trace 252, 254, 256, 258, 260, 262, 264 and 266 may be approximately 10 mils.

Figure 3:
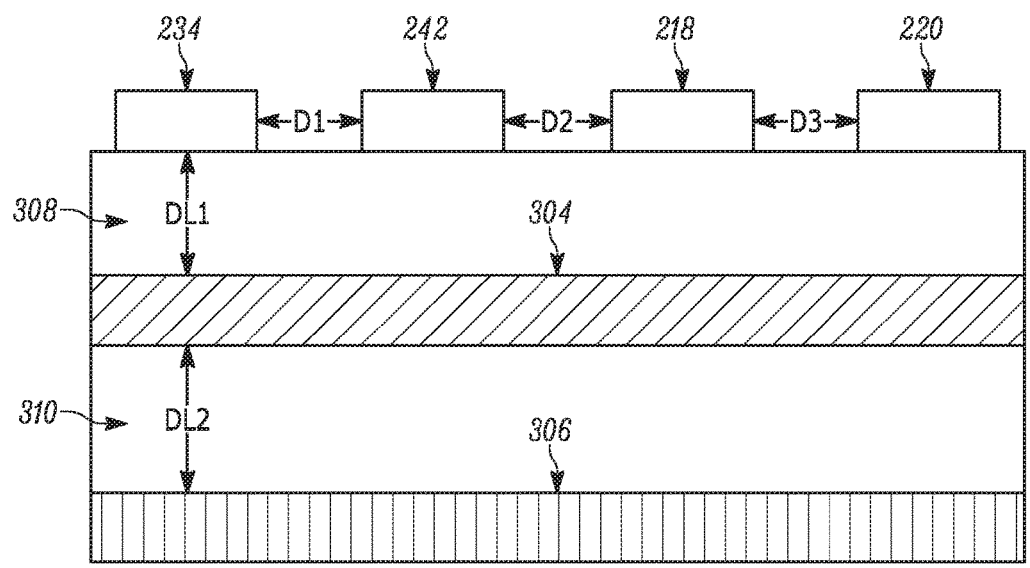
FIG. 3 is a schematic diagram of the testing framework of FIG. 1.

FIG. 3 depicts a cut away view of the connection portion 102. The connection portion 102 includes a top surface 302. The end points 236 and 238 and the termination points 268 and 270 are positioned on the top surface 302 such that the end points 236 and 238 and termination points 268 and 270 alternate across the surface 304 of the substrate. A first grounding trace 306 and a second grounding trace 308 are positioned in the dielectric layers below the top surface with the first grounding trace 304 being separated from the top surface 302 by a first dielectric layer having a height H1. The second grounding trace 306 is separated from the first grounding trace 304 by a second dielectric layer 310 having a second height H2. By adjusting the heights H1 and H2 of the dielectric layers 308 and 310, the capacitance of each trace, end point, and termination point can be adjusted. Further, the impedance of each end trace 252, 254, 256, 258, 260, 262, 264 and 266, pin trace 220, 222, 224, 226, 228 230, 232 and 234, end point 236, 238, 240, 242, 244, 246, 248 or 250 and termination point 268, 270, 272, 274, 276, 278, 280 or 282 can be adjusted by modifying the length, width and height of each respectively. By adjusting the impedance of adjacent traces, end points and termination points the adjacent traces and points can be magnetically coupled to one another eliminating crosstalk or noise. The dielectric layers are made from a material having a dielectric constant greater than 3.0 such as, but not limited to, RO XT8100, ROGERS Material, or any other material capable of isolating a high frequency electrical signal.

Figure 4:
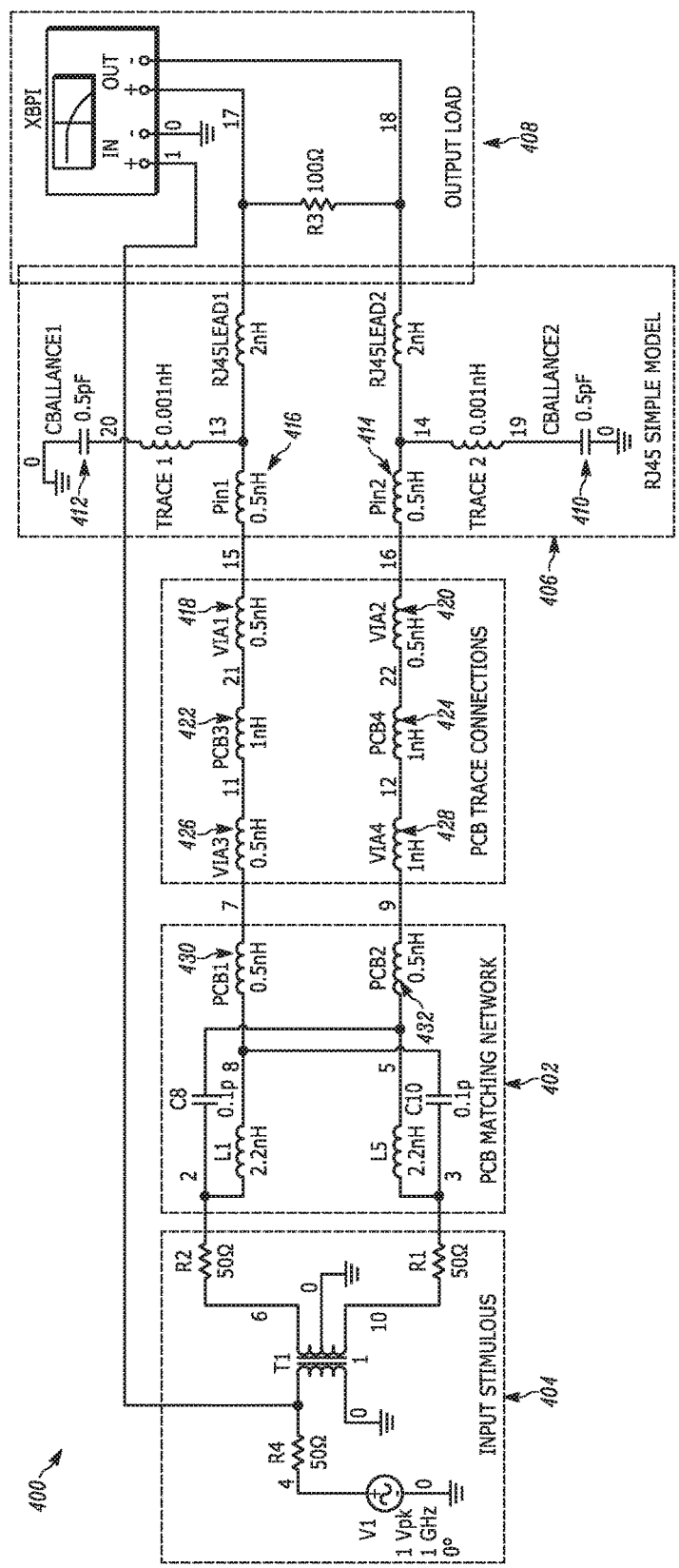
FIG. 4 depicts a diagram of the circuit formed in the testing unit of FIG. 1.

FIG. 4 depicts a diagram of the circuit formed in the testing unit 100 in FIG. 2. The schematic includes the connection portion 402, an input stimulus 404, a RJ 45 high speed communication jack 406 and a output load 408. The RJ 45 jack 406 includes internal traces 410 and 412 that are connected to pins 416 and 418 which engage vias 422 and 424. The vias 422 and 424 are electrically connected to the pin traces 424 and 426 on the testing unit 100. The length, width, height and separation distance of the end traces 252, 254, 256, 258, 260, 262, 264 and 266 and pin traces 220, 222, 224, 226, 228, 230, 232 and 234 are adjusted to create difference capacitance values along the length of the traces 104, 106, 108, 110, 112 or 114. The inductance of each pin trace is changed by adjusting the height H1 of the dielectric layer under the pin traces 220, 222, 224, 226, 228, 230, 232 or 234 and the height H2 between the second grounding trace 306 and first grounding trace 304 under each pin trace 220, 222, 224, 226, 228, 230, 232 and 234. The capacitors created by the pin traces 220, 222, 224, 226, 228, and the grounding traces 304 and 306 are sized between approximately 1 picofarads (pF) to approximately 5 pF. The top and bottom surfaces of the unit 100 may be covered in a plastic insulating layer to further enhance the operation of the circuit.

The capacitors created by the traces 104, 106, 108, 110, 112 or 114 and the grounding traces 304 and 306 are sized between approximately 0.51 pF to approximately 2 pF. The top and bottom surfaces of the unit 100 may be covered in a plastic insulating layer to further enhance the operation of the circuit. In one embodiment, signals are driven through the line using between approximately 4 mW of power and 20 mW of power.

Figure 5:
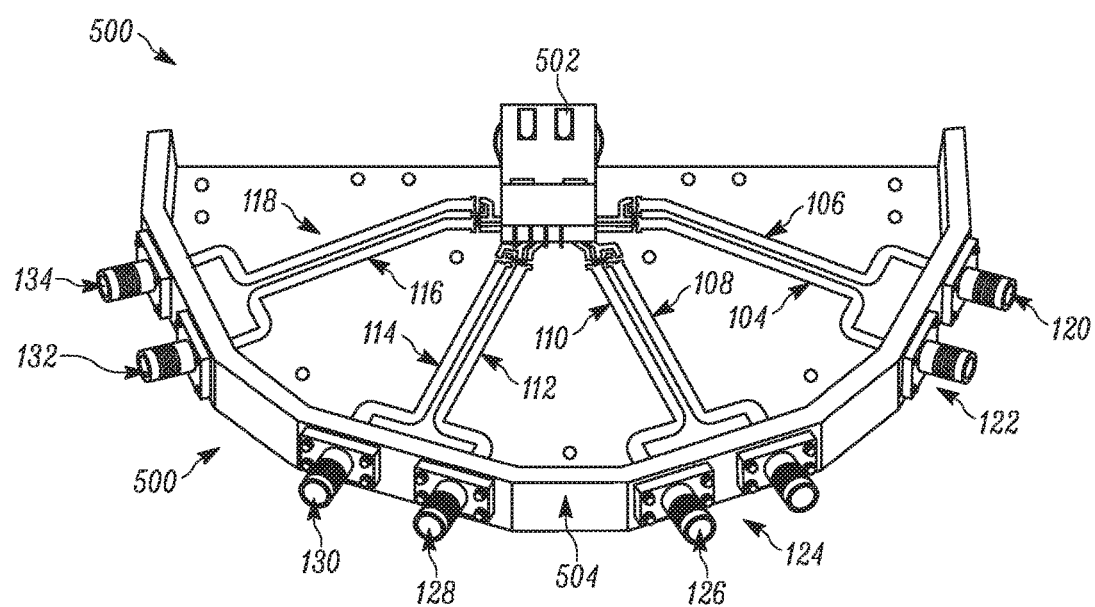
FIG. 5 depicts one embodiment of a testing unit for a high speed communication jack.

FIG. 5 depicts one embodiment of a testing unit for a high speed communication jack. The testing unit 500 includes a high speed communication jack 502 connected to the connection portion 102 of the testing unit may be a RJ type connector, Universal Serial Bus (USB) connector and jack, Fire-wire (1394) connector and jack, HDMI (High-Definition Multimedia Interface) connector and jack, D-subminiature type connector and jack, ribbon type connector or jack, or any other connector or jack receiving a high speed communication signal. The high speed communication jack 502 is connected to the connection portion 102 such that each pin on the high speed communication jack 502 corresponds to one of the vias 202, 204, 206, 208, 210, 212, 214 and 216. The high speed communications jack 502 may be configured such that pairs of pins are magnetically coupled together.

Each trace 104, 106, 108, 110, 112, 114, 116 and 118 extends from the connection portion 102 to the connection units 120, 122, 124, 126, 128, 130, 132 and 134. The connection units 120, 122, 124, 126, 128, 130, 132 and 134 are configured such that a cable having a connector, such as an RJ 45 connector, can be removably attached to each of the connection units 120, 122, 124, 126, 128, 130, 132 and 134. The connection units 120, 122, 124, 126, 128, 130, 132 and 134 transmit signals from the cable connected to the connection unit 120, 122, 124, 126, 128, 130, 132 and 134 and the associated trace 104, 106, 108, 110, 112, 114, 116 or 118 connected to the connection unit 20, 122, 124, 126, 128, 130, 132 and 134. The connection units 20, 122, 124, 126, 128, 130, 132 and 134 are affixed to a connection plate 504 that extends around the periphery of the testing unit 500. The connection plate 504 may be made of metal, such as steel, or metallized plastic. Each of the connection units 20, 122, 124, 126, 128, 130, 132 and 134 are affixed to the side surface of the connection plate 504 such that the central axis of the connection unit 20, 122, 124, 126, 128, 130, 132 and 134 is substantially parallel to the surface of the testing unit 500.

Figure 6:
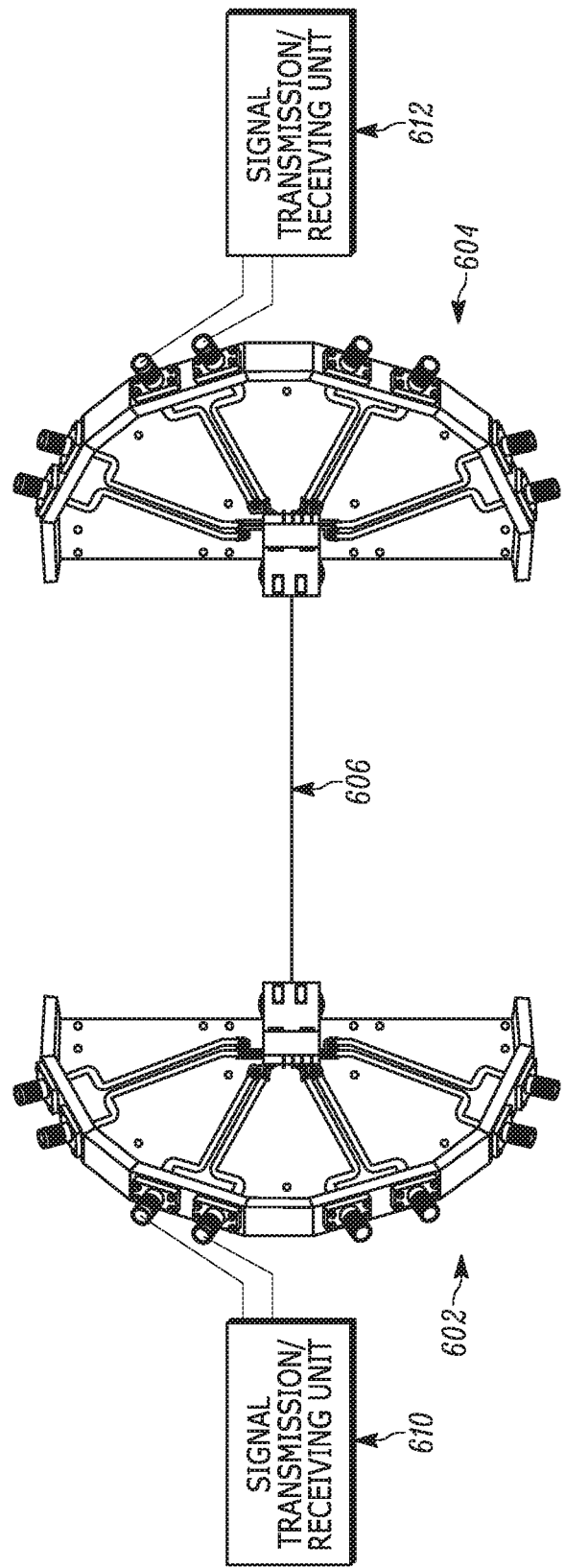
FIG. 6 depicts one embodiment of the connection of two testing units for high speed connection jacks.

FIG. 6 depicts a schematic representation of multiple testing units connected together across a network. A first testing unit 602 is connected to a second testing unit 604 by a cable 606 connected to the high speed communication jack on each of the testing unit 602 and 604. The cable 606 may be a communication cable such as an Ethernet cable, a category 5, 6, or 7 cable, a serial cable, a Fire-wire cable, a USB cable or any other type of communication cable. The cable 606 includes connectors (not shown) to allow the cable 606 to be removably connected to the high speed communication jacks. In one embodiment, the high speed communication jack on the first testing unit 602 is the same type of high speed communication jack as the second testing unit 604. In another embodiment, the high speed communication jack on the first testing unit 602 is a different type than the high speed communication jack on the second testing unit 604. The cable can be of any length including, but not limited to, 3 feet, 6, feet, 10 feet, 12 feet, 15 feet or 20 feet.

The connection units 104, 106, 108, 110, 112, 114, 116 or 118 each connect to a signal transmission and receiving unit 610 and 612 via cables coupled to the connection units 104, 106, 108, 110, 112, 114, 116 or 118 on one end and to the signal transmission and receiving units 610 and 612 on the opposite end. In one embodiment, the signal transmission and receiving unit 610 transmits a signal from the first testing unit 602 to the second testing unit 604 via the high speed connection jacks on the first and second testing units 602 and 604. Upon receiving the signal, the second testing unit 604 transmits the signal to the signal transmission and receiving unit 612. In one embodiment, the signal transmission and receiving unit 612 transmits a new signal back to the signal transmission and receiving unit 610 over the cable 606. In one embodiment, the signal transmission and receiving unit 612 transmits a second signal to the signal transmission and receiving unit 612 that is based on the signal previously transmitted by the signal transmission and receiving unit 610. In another embodiment, the signal transmission and receiving unit 612 transmits a second signal to the signal transmission and receiving unit 610 that is substantially identical to the signal previously transmitted by the signal transmission and receiving unit 610.

The preceding detailed description is merely some examples and embodiments of the present disclosure and that numerous changes to the disclose embodiments can be made in accordance with the disclosure herein without departing from its spirit or scope. The preceding description, therefore, is not meant to limit the scope of the disclosure but to provide sufficient disclosure to one of ordinary skill in the art to practice the invention with undue burden.

The invention claimed is:

1. A testing unit including:
   a substrate including a pin connection portion;
   a plurality of vias disposed in the substrate in the pin connection portion;
   a plurality of pin traces disposed on a top surface of the substrate each having a height and a width and each extending substantially radially from a respective via to an end point;
   a plurality of end traces disposed on the top surface of the substrate each having a height and a width and each extending from the end point of a respective pin trace to a termination point;

a plurality of point groups each including a pair of adjacently disposed end points disposed adjacent to a pair of adjacently disposed termination points;

a plurality of traces disposed on the top surface of the substrate each extending radially from a pair of ends of a respective trace to an edge of the substrate;

a plurality of end groups each including a pair of adjacently disposed trace end pairs;

wherein, each end group is disposed adjacent to a respective point group such that each trace end is spaced a separation distance from a respective one of end point and termination point, and a height and a width of the pin traces for each pair of adjacently disposed end points and a distance separating such adjacent pin traces are adjusted so that such adjacent pin traces are magnetically coupled.

2. The testing unit of claim 1 wherein each pin trace is separated from each trace by a first distance.

3. The testing unit of claim 1 wherein each end point is separated from each trace by a second distance.

4. The testing unit of claim 1 wherein each termination point is connected to a respective end point that is not adjacent to the termination point by an end trace.

5. The testing unit of claim 1 wherein adjacent pin traces are separated by a third distance.

6. The testing unit of claim 1 including a grounding plane in the substrate that is separated from each trace and pin trace by a distance.

7. The testing unit of claim 6 wherein the inductance and capacitance of each trace is adjusted by adjusting the first distance between the grounding plane and each trace.

8. The testing unit of claim 1 wherein the height and width of the end traces for each pair of adjacently disposed end points are adjusted so that such end traces are magnetically coupled.

9. The testing unit of claim 1 wherein the substrate is RO XT8100, Rogers material.

10. The testing unit of claim 7 wherein the capacitance of each trace is adjusted to between approximately 0.51 picofarads (pF) to approximately 2 pf.

11. The testing unit of claim 6 including a second ground plane positioned between the first ground plane and a surface of the substrate opposite the surface of the substrate having the plurality of traces and pin traces.

12. The testing unit of claim 11 wherein the inductance and capacitance of each trace is adjusted by adjusting a distance between the first ground plane and second ground plane and a distance between the first ground plane and each trace.

13. The testing unit of claim 1 wherein a pin of an RJ 45 jack is connected to each via.

14. The testing unit of claim 1 wherein each end of the pair of ends of each trace is magnetically coupled to a connection unit.

15. The testing unit of claim 14 wherein the connection unit is an RJ 45 connector.

16. The testing unit of claim 1 wherein the height and width of the termination points for each pair of adjacently disposed termination points are adjusted so that such termination points are magnetically coupled.

17. The testing unit of claim 1 wherein the height and width of the end points for each pair of adjacently disposed end points and the termination points for each pair of adjacently disposed termination points and the distance separating such adjacent end points and such adjacent termination points are adjusted so that such adjacent end points and such adjacent termination points are magnetically coupled.

18. The testing unit of claim 6 wherein the inductance and capacitance of each end point and termination point are adjusted by adjusting the distance between the grounding plane and each respective end point or termination point.

19. The testing unit of claim 6 wherein the inductance and capacitance of each pin trace is adjusted along the length of the trace by adjusting the predetermined distance between the grounding plane and each end trace.

* * * * *